United States Patent [19]
McDermott et al.

[11] Patent Number: 5,233,314
[45] Date of Patent: Aug. 3, 1993

[54] INTEGRATED CHARGE-PUMP PHASE-LOCKED LOOP CIRCUIT

[75] Inventors: Mark W. McDermott, Austin; Richard B. Reis, Garland, both of Tex.

[73] Assignee: Cyrix Corporation, Richardson, Tex.

[21] Appl. No.: 959,522

[22] Filed: Oct. 13, 1992

Related U.S. Application Data

[63] Continuation of Ser. No. 858,588, Mar. 27, 1992, abandoned.

[51] Int. Cl.$^5$ .................. H03L 7/00; H03L 7/089; H03L 7/107
[52] U.S. Cl. .................. 331/17; 331/1 A; 331/8; 331/25; 328/155
[58] Field of Search .................. 331/1 A, 8, 17, 18, 331/25; 328/155

[56] References Cited

U.S. PATENT DOCUMENTS

| | | | |
|---|---|---|---|
| 4,745,372 | 5/1988 | Miwa | 331/8 |
| 4,771,249 | 9/1988 | Burch et al. | 331/17 |
| 4,896,122 | 1/1990 | Tahernia et al. | 331/158 |
| 4,920,320 | 4/1990 | Matthews | 328/155 |
| 4,931,748 | 6/1990 | McDermott et al. | 331/1 |

OTHER PUBLICATIONS

Stetzler, "Clock Circuit Design Considerations for High Performance VSLI Processors," (U. Cal., 1985).
"Phase-Locked Loop Design Fundamentals" (Motorola, date unknown).
Gardner, "Phase Accuracy of Change Pump PLL's," *IEEE Trans. Commun.*, vol. Com-30 Oct. 1982), pp 2362-2363.
Johnson et al., "A Variable Delay Line PLL for CPU/-Comprocessor Synchronization", *IEEE J. Solid State Cir*, vol. 23, No. 5 (Oct. 1988) pp. 1218-1223.
Gardner, "Charge-Pump Phase-Lock Loops", *IEEE Trans. Commun.* vol. Com-28 Nov 1980), pp. 1849-1858.
Jeong, et al., "Design of PLL-Based Clock Generation Circuits", *IEEE J. Solid State Cir.*, vol. SC-22, No. 2 (Apr., 1987), pp. 255-261.

*Primary Examiner*—David Mis
*Attorney, Agent, or Firm*—Vinson & Elkins

[57] ABSTRACT

A variable bandwidth phase-locked loop clock generator circuit is disclosed. The PLL circuit includes a phase comparator which presents pump-up and pump-down signals, indicating the polarity of the desired frequency change. The phase comparator also generates multiple level control outputs to control the rate of the frequency change. A current source includes a reference leg having a plurality of resistors which are shorted out according to the control outputs, from which a bias signal is generated. The level of the bias signal controls current sources in the output leg of the current source to control the rate of change of the voltage applied to the voltage controlled oscillator. In addition, the bias signal also controls the slew rate of an active low-pass filter according to the desired response characteristic; the output of the filter is applied to the voltage controlled oscillator for generating the output clock signal. This construction of the PLL circuit allows for the control signals to control the rate of change both for advancing and retarding the output clock frequency, and allows for on-chip implementation of the filter components in a manner compatible with MOS technology.

21 Claims, 5 Drawing Sheets

INTEGRATED CHARGE-PUMP PHASE-LOCKED LOOP CIRCUIT

The present application is a continuation of copending application Ser. No. 858,588, filed Mar. 27, 1992, now abandoned.

This invention is in the field of integrated circuits, and more specifically is directed to phase-locked loops as used in clock generation and control.

BACKGROUND OF THE INVENTION

Recent advances in integrated circuit manufacturing technology have enabled the implementation of higher numbers of transistors on single integrated circuit chips, and also have increased their performance, especially for high density synchronous circuits, such as microprocessors, math co-processors, single-chip microcomputers and the like. Such higher performance is generally obtained from synchronous circuits by increasing the frequency of the clock signal controlling the circuit. For example, the microprocessors in modern personal computers and workstations currently operate at clock frequencies of up to 40 MHz, with higher frequencies expected to follow.

Particularly at extremely high clock frequencies, parasitic impedances, propagation delays, and other effects can cause the clock signals that are applied to different integrated circuits within a computer to be skewed in time relative to one another. As a result, inter-chip communication within such computers is made more difficult at higher frequencies, requiring wait states or other techniques to be used to reliably communicate data. The synchronization of multiple chips thus tends to degrade the rate at which data can be communicated within the system, and thus degrading overall system performance. In addition, high frequency clock signals are especially vulnerable to certain instabilities in their duty cycle, to noise, ringing, and other similar effects, each of which may cause errors in the internal operation of the integrated circuits receiving such signals.

Phase-locked loops (PLLs) are conventionally implemented onto integrated circuits to overcome these problems. As is fundamental in the art, a PLL consists of a phase detector circuit, a low pass loop filter, and a voltage controlled oscillator (VCO). The phase detector circuit compares the phase of the input clock signal with the output of the VCO, and presents a control voltage to the VCO (after filtering by the loop filter) to adjust the frequency of the output signal. After several cycles, the PLL locks onto the input clock signal, and presents an output having a stable frequency and phase. A frequency divider may be connected to the output of the VCO, depending upon the VCO free-running frequency, so that the PLL output frequency matches that of the input clock signal. In addition, as is well known, frequency dividers in the output and feedback loops of the PLL can also allow frequencies other than that of the input clock signal to be generated. U.S. Pat. No. 4,931,748, issued Jun. 5, 1990, describes an implementation of one example of a phase-locked loop in an integrated circuit such as a microprocessor.

A particularly useful type of PLL for high speed integrated circuits is the charge-pump PLL. As described in Gardner, "Charge-Pump Phase-Lock Loops", *IEEE Trans. Commun.*, Vol. COM-28 (November 1980), pp. 1849–1858, a charge pump may be provided to charge or discharge a capacitor in the loop filter according to the polarity of the phase difference between the input clock signal and the output signal. FIG. 2b of this reference illustrates a typical implementation of a charge-pump loop filter, where the phase detector generates an up (U) signal or a down (D) signal according to the polarity of the phase difference, and where the charge pump connects either a charging or a discharging current source to the capacitor according to the U and D signals. A conventional phase detector for generating the U and D signals is described in Jeong et al., "Design of PLL-Based Clock Generation Circuits", *IEEE J. Solid State Circ.*, Vol. SC-22, No. 2 (April, 1987), pp. 255–261.

In the art of PLL-based clock generation, one must generally tradeoff fast response of the PLL to a new input clock frequency, on one hand, with frequency stability, on the other hand. By way of further background, U.S. Pat. No. 4,771,249, issued Sep. 13, 1988, describes a charge-pump PLL having a wide-bandwidth mode and a narrow-bandwidth mode. The charge pump disclosed in this reference includes a current mirror which sets a fixed current in an output leg based on a fixed current in a reference leg. In the wide-bandwidth mode, the charge pump is controlled to switch in an additional output leg to source or sink additional current; the additional output leg is switched out in the narrow-bandwidth mode. Control of the switching in and out of the additional output leg is disclosed as being dependent on the output frequency varying above and below the desired frequency a predetermined number of times. By way of further background, U.S. Pat. No. 4,920,320, issued Apr. 24, 1990, discloses a circuit for stabilizing the switching operation in the charge-pump PLL disclosed in the above-referenced U.S. Pat. No. 4,771,249.

By way of further background, U.S. Pat. No. 4,745,372 describes a PLL clock generator circuit including a current-variable charge pump operable in modes having different bandwidths, depending upon a phase lock signal generated by the phase comparator. As shown in FIGS. 10 and 11 of this reference, in one disclosed embodiment, two current mirrors are used to control the rate at which charging and discharging of the pumped output node, according to complementary signals generated by integrating the phase lock signal.

By way of further background, passive loop filters in conventional PLLs generally require the use of a sufficiently large capacitor that integration of the capacitor into the PLL integrated circuit is not practicable. As such, conventional PLLs generally require an external capacitor to be connected to a terminal of the circuit. Such use of an external capacitor is, of course, generally undesirable due to the increased manufacturing cost, the incrementally increasing likelihood of failure due to an additional connection, and the effects of the additional parasitic inductance of the external connection, especially at high frequencies. Furthermore, variations in the capacitance value of an external component will generally not match variations in the manufacture of the integrated circuit, and thus the performance characteristics of such PLLs may widely vary.

It is an object of the present invention to provide a fully-integrated charge pump PLL having a fast response time to input frequency changes as well as highly stable behavior in the phase-locked condition.

It is a further object of the present invention to provide such a circuit which has selectably variable response times in the loop filter.

It is a further object of the present invention to provide such a circuit in which the slew rate of the loop filter is controlled according to the relationship between the input and feedback clock signals.

It is a further object of the present invention to provide such a circuit which is especially useful for high frequency operation.

It is a further object of the present invention to provide such a circuit which may be efficiently implemented into the integrated circuit.

It is a further object of the present invention to provide such a circuit which may have several selectable response rates.

It is a further object of the present invention to provide such a circuit in which the bandwidth may be selected independently of the polarity of the desired change in output clock frequency.

It is a further object of the present invention to provide such a circuit which may be selectably enabled and disabled.

Other objects and advantages of the present invention will be apparent to those of ordinary skill in the art having reference to the following specification in conjunction with the drawings.

SUMMARY OF THE INVENTION

The invention may be incorporated into an integrated phase-locked loop circuit having a phase comparator, charge pump loop filter, and voltage controlled oscillator (VCO). The phase comparator is constructed to provide pump-up and pump-down signals to adjust the output frequency of the VCO according to which of the clock signals leads the other. In addition, the phase comparator also generates multiple level signals based on the number of pump-up and pump-down cycles that have occurred, and thus based on the number of times the VCO output frequency overshoots and undershoots the input frequency during the locking operation. The charge pump is constructed as a current mirror having a reference leg with multiple resistors, each resistor connected in parallel with a shorting transistor gated by one of the level signals from the phase comparator. The resistance in the reference leg of the current mirror controls the current in an output leg of the current mirror, which in turn controls the time rate of change of a capacitor voltage at the charge pump output. The capacitor voltage is filtered by an active loop filter (which may be integrated into the integrated circuit), and the slew rate of the active filter is controlled by a mirrored current source relative to the reference leg in the charge pump current mirror. The circuit is completed by a conventional VCO to generate the output clock.

DETAILED DESCRIPTION OF THE PREFERRED EMBODIMENT

Figure 1:
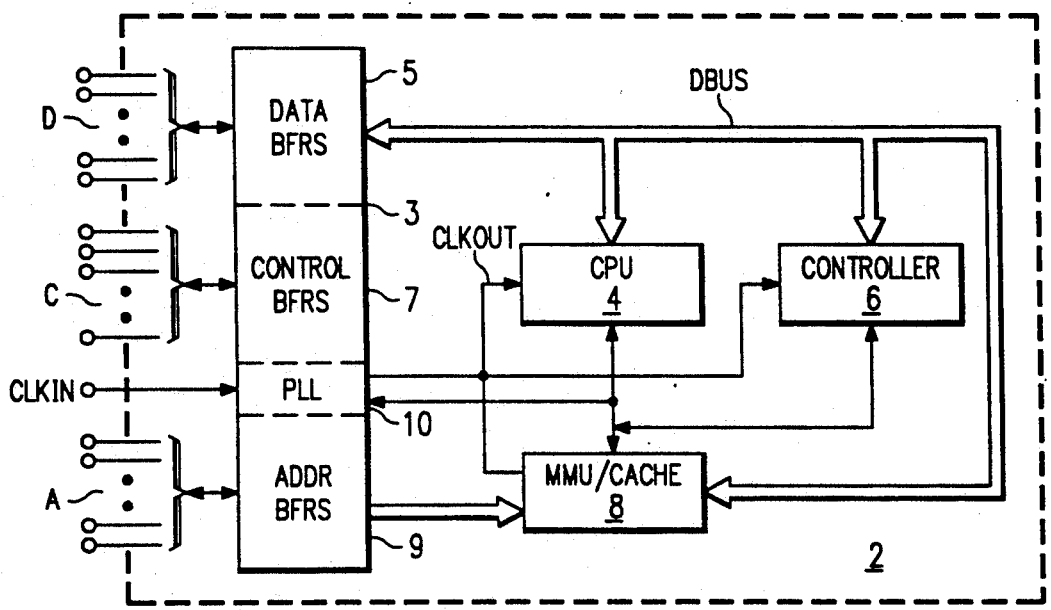
FIG. 1 is an electrical diagram, in block form, of an integrated circuit incorporating the preferred embodiment of the invention.

Referring first to FIG. 1, integrated circuit 2 incorporating the preferred embodiment of the invention will now be described. In this example, integrated circuit 2 is a high density synchronous circuit such as a microprocessor or math co-processor, and as such includes CPU 4, controller 6, and memory management unit 8 (which may include a cache), all connected to an internal data bus DBUS. Controller 6 controls the other portions of integrated circuit 2 by way of various control lines (some of which are shown in FIG. 1), in the conventional manner. Integrated circuit 2 further includes interface unit 3, including bidirectional data buffers 5 in communication with data terminals D, control buffers 7 in communication with control terminals C, and address buffers 9 in communication with address terminals A, all in the conventional manner. Interface unit 3 further includes phase-locked loop (PLL) clock generator 10, which receives an input clock signal on line CLKIN and which presents an output clock signal on line CLKOUT to the CPU 4, controller 6 and MMU 8.

While PLL clock generator 10 is shown in FIG. 1 as receiving an externally generated clock signal, in the alternative and as is conventional in the art, an oscillator may be implemented within interface unit 3, such that connection of a crystal to terminal CLKIN will cause the on-chip oscillator to produce the input clock signal to PLL clock generator 10. The present invention is beneficial in the generation of internal clock signals in either case (i.e., the externally presented clock signal or the clock signal generated by an on-chip crystal oscillator). In particular, many systems include a first integrated circuit, such as the main microprocessor or CPU, that includes an on-chip oscillator for generating its internal clock signal, and a clock signal that is presented at one of its output terminals to be presented as an external clock signal to other circuits in the system; the PLL clock generator circuit according to the present invention is especially useful to synchronize the operation of the slaved circuits to the master circuit that generates the clock signal.

Figure 2:
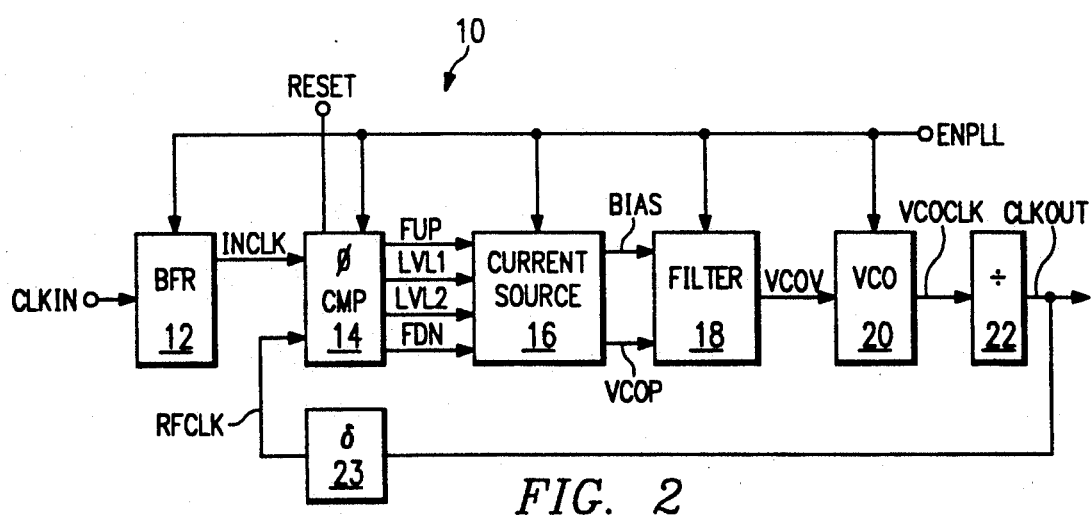
FIG. 2 is an electrical diagram, in block form, of the phase-locked loop clock generator circuit constructed according to the preferred embodiment of the invention.

Referring next to FIG. 2, the construction of PLL clock generator 10 according to the preferred embodiment of the invention will now be described. Buffer 12 is connected to terminal CLKIN, and buffers the incoming clock signal thereat in the conventional manner, providing the buffered clock signal on line INCLK to phase comparator 14 (this buffered clock signal will be referred to hereinbelow as the input clock signal). Phase comparator 14 also receives a feedback clock signal on line RFCLK from the output of PLL clock generator 10, delayed by delay stage 23 as desired. Phase comparator 14 also receives control inputs on lines RESET and ENPLL from elsewhere in integrated circuit 2, such as from controller 6; line ENPLL is connected to buffer 12 and other elements of PLL clock generator circuit 10 to enable or disable the PLL function. When enabled, phase comparator 14 compares the phase of the clock signals on lines INCLK and RFCLK, and generates output signals on lines FUP, FDN, LVL2, LVL1 based upon this comparison. For purposes of this example, line FUP indicates that the frequency of the output clock signal is to increase, line FDN indicates that the frequency of the output clock signal is to decrease, and lines LVL2, LVL1 control the rate of change of the frequency according to the degree to which the input and reference clock signals are synchronized with one another.

Lines FUP, FDN, LVL2, LVL1 are received at inputs of current source 16. Current source 16 generates an output voltage on line BIAS and an output current which charges and discharges a voltage on line VCOP; both lines BIAS, VCOP are presented to loop filter 18 to control the voltage level on line VCOV presented to voltage controlled oscillator (VCO) 20. In this example, and as will be described in further detail hereinbelow, the voltage on line BIAS controls a p-channel transistor serving as the output current source in filter 18. The voltage on line VCOP is filtered by loop filter 18, with the filtered voltage appearing on line VCOV at the output of loop filter 18 and connected to conventional voltage controlled oscillator (VCO) 20. As such, the voltage on line VCOP controls the frequency of the output clock signal therefrom on line VCOCLK, and the voltage on line BIAS controls the slew rate of loop filter 18; as is well known in the art, the slew rate of an active filter is the maximum time rate of change of the output voltage.

The output clock signal from VCO 20 is divided down by conventional frequency divider 22 to generate the output clock signal communicated on line CLKOUT to the other elements of integrated circuit 2 (see FIG. 1). The output clock signal on line CLKOUT is also communicated to phase comparator 14 as the feedback clock signal on line RFCLK, after delay by delay stage 23. Delay stage 23 may be configured as a series of inverters or other gate delays, or other conventional elements. The purpose of delay stage 23 is to allow PLL clock generator 10 to generate an output clock signal on line CLKOUT that is different in phase than the input clock signal on line INCLK, while still maintaining the phase-locked condition.

Figure 3:
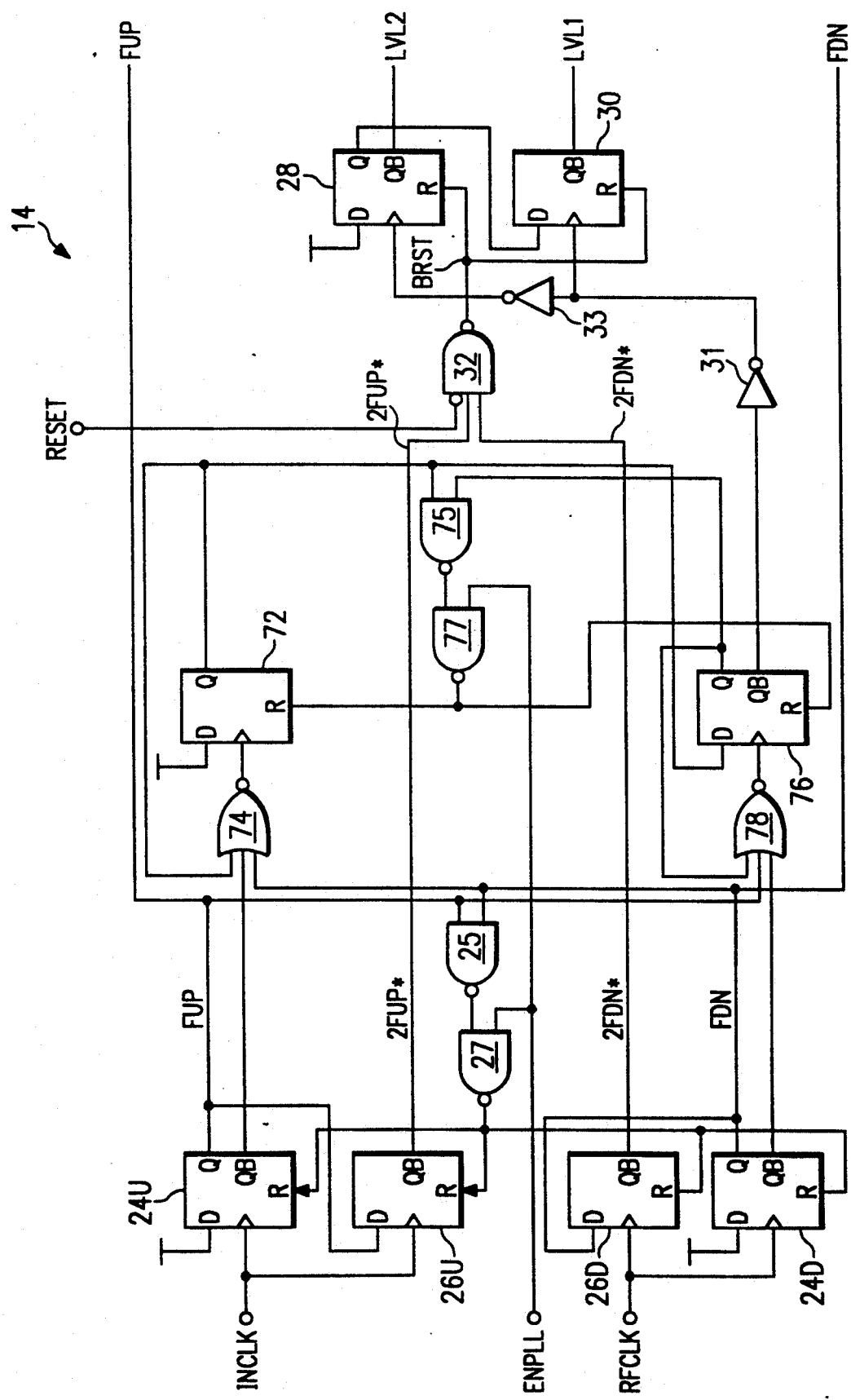
FIG. 3 is an electrical diagram, in schematic form, of the phase comparator in the PLL clock generator circuit constructed according to the preferred embodiment of the invention.

Referring now to FIG. 3, the construction of phase comparator 14 will now be described in detail. As indicated hereinabove, phase comparator 14 generates "pump-up" and "pump-down" control signals (on lines FUP and FDN, respectively) that will, via current source 16 and loop filter 18, control VCO 20 to increase and decrease, respectively, the frequency of its output clock signal responsive to the phase relationship between the input clock signal on line INCLK and the fedback output clock signal on line RFCLK. In this example, if the clock signal on line INCLK leads that on line RFCLK, line FUP will be driven high (with line FDN remaining low) to cause VCO 20 to advance the frequency of its output clock signal to catch up to the input clock signal; if the clock signal on line INCLK lags that on line RFCLK, line FDN will be driven high (with line FUP remaining low), indicating to VCO 20 that it is to retard the frequency of its output clock signal.

Phase comparator 14 generates the signals on lines FUP and FDN in the conventional manner for phase-frequency detectors (PFDs). D-type flip-flops 24U, 24D each have their D input tied to $V_{cc}$, and have their clock inputs connected to lines INCLK, RFCLK, respectively. The Q output of flip-flop 24U drives line FUP and the Q output of flip-flop 24D drives line FDN, and each of these Q outputs are connected to an input of NAND gate 25. The output of NAND gate 25 is connected to an input of NAND gate 27, as is line ENPLL from controller 6, and the output of NAND gate 27 is connected to the reset inputs of flip-flops 24U, 24D. NAND gate 25 is preferably constructed in the well-known manner to compensate for the body effect, thus ensuring balanced response relative to each of its inputs.

In the disabled state, with line ENPLL low, the output of NAND gate 27 is forced high, thus maintaining flip-flops 24U, 24D in the reset state. In the enabled state (line ENPLL high), NAND gate 27 merely inverts the output of NAND gate 25, enabling the operation of this portion of phase comparator 14 in the conventional manner. If a rising edge of the clock on line INCLK is received prior to a rising edge of the clock on line RFCLK, this edge clocks the high level at the D input of flip-flop 24U to its Q output on line FUP, and thus to one input of NAND gate 25; the later rising edge on line RFCLK clocks a high level to the Q output of flip-flop 24D, in turn driving a high level at the reset inputs of flip-flops 24U, 24D, resetting low both of lines FUP, FDN. Accordingly, the high level on line FUP is maintained for approximately the duration of the phase difference between the clock signals on lines INCLK and RFCLK, which in turn will cause the frequency of VCO 20 to advance by an amount corresponding to this phase difference. Conversely, in the event that the clock signal on line RFCLK leads that on line INCLK, a high level will be similarly generated on line FDN for the duration of the phase difference, causing VCO 20 to retard its output clock frequency. As noted hereinabove, this operation of this portion of phase comparator 14 is conventional in the art.

Phase comparator 14 according to the preferred embodiment of the invention further includes circuitry for presenting level signals to current source 16 on lines LVL2, LVL1 corresponding to the number of pump-up/pump-down cycles generated by phase comparator 14, and thus the number of overshoot/undershoot cycles of the output clock signal frequency relative to the input clock frequency. These level signals on line LVL2, LVL1 reduce the rate at which VCO 20 is to change its output frequency with the occurrence of pump-up/pump-down cycles. As a result, according to the present invention, the output clock frequency converges to the input clock frequency with each pump-up/pump-down cycle.

Referring still to FIG. 3, this control of the level signals on lines LVL2, LVL1 is implemented by D-type flip-flops 26U, 26D which each also receive, at their respective clock inputs, lines INCLK, RFCLK similarly as flip-flops 24U, 24D; the reset inputs of flip-flops 26U, 26D also receive the output of NAND gate 27. The D input of flip-flop 26U receives the Q output of flip-flop 24U and has its QB output (complement) connected to line 2FUP*; similarly, the D input of flip-flop 26D receives the Q output of flip-flop 24D and has its QB output connected to line 2FDN*. As such, flip-flop 26U drives line 2FUP* to a low logic level responsive to receipt of two rising edges of the clock signal on line INCLK without a reset caused by a rising edge of the clock signal on line RFCLK; similarly, flip-flop 26D drives line 2FDN* to a low logic level responsive to two rising edges of the clock signal on line RFCLK without a reset caused by a rising edge of the clock signal on line INCLK. Active signals on lines 2FUP*, 2FDN* thus indicate that the frequencies of the input and reference clock signals differ from one another by at least a factor of two.

Lines 2FUP*, 2FDN* are connected to inputs of NAND gate 32; an inverting input of NAND gate 32 receives line RESET from elsewhere in the integrated circuit, such as from controller 6 in FIG. 1. The output of NAND gate 32, on line BRST, is connected to the reset input of flip-flops 28 and 30. Flip-flop 28 generates a signal to current source 16 on line LVL2 from its QB (complementary) output, and flip-flop 30 generates a similar signal to current source 16 on line LVL1 from its QB (complementary) output. The D input of flip-flop 28 is biased to $V_{cc}$, and its Q output is connected to the D input of flip-flop 30; the clock inputs to flip-flops 28, 20 will be generated as described hereinbelow. In this example, flip-flops 28, 30 are thus interconnected as a shift register to drive the two lines LVL2, LVL1, which control the rate at which current source 16 and filter 18 respond to change the frequency of VCO 20. It will be apparent to those in the art that additional shift register bits may be similarly implemented to control additional level signals to provide even finer control of the response of current source 16 and loop filter 18, if desired.

NOR gate 74 has an input connected to the QB output of flip-flop 24U, and an input connected to the Q output of flip-flop 24D (line FDN). The output of NOR gate 74 is connected to the clock input of flip-flop 72, which has its D input tied to $V_{cc}$ and its Q output fed back to a third input of NOR gate 74. As such, NOR gate 74 and flip-flop 72 operate as a latch, as the clock input receives a high level responsive to both the Q output of flip-flop 24D and the QB output of flip-flop 24U low, together with the Q output of flip-flop 72 itself low; this condition corresponds to line FUP being high and line FDN being low. Upon the high level of $V_{cc}$ clocked into flip-flop 72, the high level at the Q output of flip-flop 72 communicated to NOR gate 74 ensures that no further clocking of flip-flop 72 occurs until reset.

Similarly, NOR gate 78 receives the Q output of flip-flop 24U and the QB output of flip-flop 24D at its inputs, and has its output connected to the clock input of flip-flop 76. Flip-flop 76 has its D input connected to receive the Q output of flip-flop 72, so that flip-flops 72, 76 serve as a shift register; its QB (complementary) output is connected to the clock input of flip-flop 30 via inverter 31, and to the clock input of flip-flop 28 via inverters 31 and 33. The Q output of flip-flop 76 is connected back to a third input of NOR gate 78, so that flip-flop 76 and NOR gate 78 form a latch. Flip-flop 76 is thus clocked responsive to both the Q output of flip-flop 24U and the QB output of flip-flop 24D low, together with the Q output of flip-flop 76 itself low; this condition corresponds to line FDN being high and line FUP being low.

NOR gates 74, 78 are preferably constructed in the well-known manner to compensate for the body effect, thus ensuring balanced response relative to each of its inputs. Such compensation (for example by providing parallel pull-up legs with the transistor order reversed) is preferred so that neither of NOR gates 74, 78 will clock its associated flip-flop 72, 76 responsive to substantially simultaneous pulses on lines FUP, FDN, as will occur upon each clock rising edge in the phase-locked condition. Accordingly, only if a significant phase difference exists between the input clock signal on line INCLK and the output clock signal on line RFCLK will either of the flip-flops 72, 76 be clocked. As a result, brief "runt" pulses will not be applied to flip-flops 72, 76, nor will such pulses otherwise affect the control of the level signals on lines LVL2, LVL1.

The reset input of each of flip-flops 72, 76 are controlled by the output of NAND gate 77, which receives line ENPLL at one input and the output of NAND gate 75 at another input. NAND gate 75 receives the Q outputs of flip-flops 72, 76 at its input. Accordingly, in the enabled state (line ENPLL high), flip-flops 72, 76 are reset responsive to both of their Q outputs being high. This reset thus occurs once both a pump-up event and a pump-down event have been initiated, corresponding to the feedback clock signal on line RFCLK having been both at too low a frequency and at too high a frequency.

In its general operation, this example of phase comparator 14 drives lines LVL2, LVL1 high in conditions when VCO 20 is to quickly change its output frequency. In this example, the maximum rate of change of frequency is enabled by a reset state (line RESET driven high), or upon either of lines 2FUP* or 2FDN* making a high-to-low transition (indicating that two rising edges of one clock signal have been received without receiving a rising edge of the other), either condition causing NAND gate 32 to drive line BRST high, and reset high the QB outputs of both flip-flops 28, 30 on lines LVL2, LVL1, respectively.

Also in this example, phase comparator 14 drives lines LVL2, LVL1 low in certain conditions when VCO 20 is to have a reduced time rate of change of its output frequency (i.e., as the phase and frequency of the clock signals approach one another). In this example, line LVL2 is necessarily driven low prior to line LVL1 driven low, as flip-flops 28, 30 are connected in shift register fashion, and as flip-flop 28 is the first bit. Flip-flop 28 is clocked by the QB output of flip-flop 76 making a low-to-high transition, which occurs upon its reset. As indicated above, this reset condition occurs upon the occurrence of a pump-up cycle (line FUP being driven high for a substantial time) followed by a pump-down cycle (line FDN being driven high for a substantial time). For example, beginning from a reset condition, line LVL2 thus is driven low once the frequency of VCO 20 has risen to the extent that the clock on line RFCLK first leads the clock on line INCLK (line INCLK previously leading line RFCLK). As will be more apparent hereinbelow, line LVL2 going low will slow down the rate of change of the output frequency of VCO 20.

Line LVL1 is driven low by flip-flop 30 clocking in a high logic level at its D input; this high level is present once line LVL1 is driven low. The clock input of flip-flop 30 receives a high level upon the clocking of flip-flop 76, which occurs responsive to both a pump-up and a pump-down event after flip-flops 72, 76 have been reset. Accordingly, upon the next cycle of a pump-up (line FUP high) followed by a pump-down (line FDN high) after line LVL2 is driven low, NOR gate 78 will clock a high level into flip-flop 76, which in turn will clock the high level at the Q output of flip-flop 28 (on line LVL2) into flip-flop 30, driving line LVL1 low and further decreasing the rate of change of the frequency of VCO 20, as will be discussed in further detail hereinbelow.

In the alternative to the above arrangement, the D input of flip-flop 76 may be biased to $V_{cc}$, in which case flip-flop 30 will be clocked responsive to line FDN first being driven high for a substantial time (i.e., without line FUP being high) after flip-flops 72, 76 are reset.

Once lines LVL2, LVL1 are both low, PLL clock generator 10 is in its most stable condition, with VCO 20 responding to change its output frequency at the slowest rate, as will be described below. At such time as the clocks on lines INCLK, RFCLK become significantly different from one another, however, which in this example is where two rising edges of one clock are received before a rising edge of the other, the signals on one of lines 2FUP*, 2FDN* will, via NAND gate 32, reset flip-flops 28, 30 to drive lines LVL2, LVL1 to a high level, maximizing the time rate of change of the frequency of VCO 20.

Figure 4:
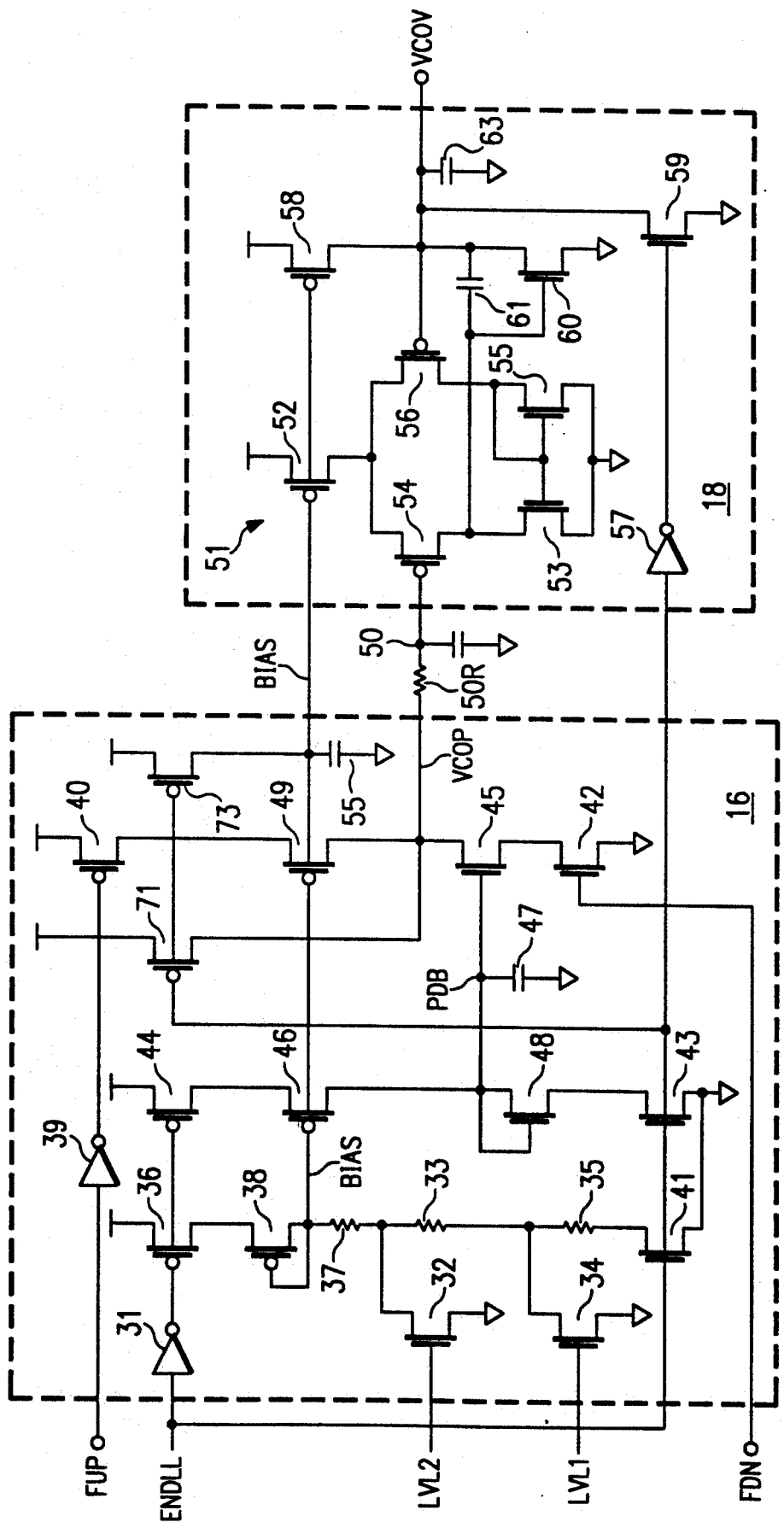
FIG. 4 is an electrical diagram, in schematic form, of the charge pump and loop filter in the PLL clock generator circuit constructed according to the preferred embodiment of the invention.

Referring now to FIG. 4, the construction of current source 16 and loop filter 18 will now be described in detail. Current source 16 is constructed as a current mirror, as will be apparent from the following description, and as such is capable of controlling its output to a highly variable degree depending upon the resistance in its reference leg. This construction provides for a high degree of flexibility in selecting the time rate of change of the output frequency of VCO 20 relative to the phase comparison performed by phase comparator 14. As a result, PLL clock generator 10 according to the preferred embodiment of the invention can rapidly lock on to a new input clock frequency (or can rapidly reset), while still providing a high degree of stability in steady-state operation.

In the output leg of current source 16, line FUP controls via inverter 39) the gate of p-channel pull-up transistor 40. Transistor 40 has its source biased to $V_{cc}$, and its drain coupled to output node VCOP via the source-/drain path of p-channel mirror transistor 49. Similarly, line FDN is received by the gate of n-channel pull-down transistor 42, which has its source biased to ground and its drain coupled to node VCOP via the source/drain path of n-channel mirror transistor 45. Capacitor 50 is connected to line VCOP via series resistor 50R. Accordingly, a high level on line FUP will tend to charge capacitor 50 from $V_{cc}$ and raise the voltage of line VCOP, and a high level on line FDN will tend to discharge capacitor 50 and lower the voltage on line VCOP.

The reference leg of current source 16 includes p-channel transistors 36 and 38 having their source/drain paths connected in series between node BIAS and $V_{cc}$; the gate of p-channel transistor 36 receives the enable signal from line ENPLL (inverted by inverter 31), while the gate of p-channel transistor 38 is connected to its drain at node BIAS. This reference leg also includes n-channel transistor 41 having its drain coupled to node BIAS via series resistors 33, 35, 37, having its source biased to ground, and receiving line ENPLL at its input. Resistor 33 has n-channel transistor 32 connected in parallel therewith, transistor 32 having its source connected to ground and its gate receiving line LVL2 from phase comparator 14; similarly, resistor 35 has n-channel transistor 34 connected in parallel therewith, transistor 34 having its source also at ground and its gate receiving line LVL1 from phase comparator 14. Transistors 32, 34 are preferably sufficiently large as to effectively short out the resistors 33, 35 in parallel therewith, when on. The value of resistors 33, 35, 37 are preferably selected according to the desired variations in the loop gain of loop filter 18, and thus the desired response of VCO 20 to pump-up and pump-down signals at the various stages of the phase-locking process.

Accordingly, when enabled by a high level on line ENPLL, this reference leg effectively consists of the series connection of p-channel transistor 38, connected in diode fashion, and resistors 33, 35, 37 (to the extent not shorted out by transistors 32, 34). Node BIAS at the drain of transistor 38 serves as the output of this first reference leg, having a voltage dependent upon the resistance provided by those of resistors 33, 35, 37 remaining in series with transistor 38, and thus on the current conducted through the reference leg between $V_{cc}$ and ground.

Current source 16 further includes a second reference leg including enable p-channel transistor 44 and enable n-channel transistor 43, connected similarly as transistors 36, 41, respectively, in the reference leg. The second reference leg also includes p-channel transistor 46 having its source connected to the drain of transistor 44, and having its gate connected to line BIAS. N-channel transistor 48 has its gate connected to its drain and to the drain of transistor 46 at node PDB, and has its source connected to the drain of transistor 48. Node PDB at the drains of transistors 46, 48 (and at the gate of transistor 48) is also connected to the gate of n-channel transistor 45 in the output leg of current source 16.

The purpose of the second reference leg is to bias transistor 45 in a similar manner as transistor 49 is biased by line BIAS from the first reference leg, so that the current between node VCOP and ground through transistors 45 and 42 matches that between $V_{cc}$ and node VCOP through transistors 40 and 49, when both lines FDN and FUP are high. This balance is highly preferred since, in a phase-locked condition, both lines FDN and FUP will be high for a brief time upon each rising edge of the clocks, but no modulation of the voltage on line VCOP is desired. As such, it is highly preferred that charging and discharging currents presented to line VCOP by transistors 40 and 42 match one another, so that the net charging and discharging current to capacitor 50 is zero. To further achieve such balance, it is highly preferred the transistors in similar positions in the reference and output legs substantially match one another. In this example, transistors 41, 42 and 43 preferably match one another, as should transistors 36, 40, and 44.

Nodes PDB and BIAS are also preferably connected to relatively large capacitors 47, 55, respectively, each of which are biased to ground. These capacitors are provided in order to overcome the Miller effect capacitance of transistors 49, 45, and thus to avoid bootstrapping conditions at their gates upon transistors 40, 42, respectively, being turned on. As such, the size of each of capacitors 47, 55 should be sufficient that the gate-tosource capacitance of its respective transistor 49, 45 is insignificant.

Lines VCOP and BIAS are also connected to the sources of p-channel disable transistors 71, 73, respectively, each of which have their source biased to $V_{cc}$ and their gates driven by line ENPLL. As such, when disabled (line ENPLL low), node VCOP and BIAS are each pulled to $V_{cc}$.

In general operation when enabled (line ENPLL high), the voltage of line BIAS is set by the series resistance between it and ground through resistors 33, 35, 37 and transistors 32, 34. As noted hereinabove, when the maximum response is selected by lines LVL2, LVL1 both high, line BIAS will be pulled to its lowest possible level (e.g., to one n-channel threshold voltage above ground), increasing the current through the reference leg. This condition will turn transistor 46 on quite strongly, increasing the current therethrough and biasing node PDB at the drain of transistor 48 toward $V_{cc}$. This condition (line BIAS low and node PDB high) will provide a relatively large charging or discharging current in the output leg of current source 16, and so that the voltage of line VCOP rapidly changes upon either line FUP or line FDN being active.

Conversely, if both lines LVL2, LVL1 are low, line BIAS will be at a relatively high voltage, weakly turning on transistor 46. The current through transistor 46 will thus be relatively low, biasing node PDB more nearly toward ground. As a result, with line BIAS relatively high and node PDB relatively low, the charging and discharging current in the output leg of current source 16 will be quite weak. The voltage at line VCOP will thus only be able to change relatively slowly responsive to an active state on either line FUP or line FDN. Accordingly, the state of lines LVL2, LVL1 determine the magnitude of the current in the output leg of current source 16, and thus determine the rate at which the voltage on line VCOP can be raised or lowered.

In this embodiment of the invention, loop filter 18 is an active filter including a unity gain operational amplifier 51. Op amp 51 includes a non-inverting input at the gate of p-channel transistor 54 (which receives line VCOP via series resistor 50R) and an inverting input at the gate of p-channel transistor 56 (which receives the output on line VCOV). Op amp 51 further includes a current source formed by p-channel transistor 52 having its source biased to $V_{cc}$ and its gate connected to line BIAS from current source 16; the drain of transistor 52 is connected to the sources of p-channel transistors 54, 56, at a current summing node. The drains of transistors 54, 56 are connected to the drains of n-channel transistors 53, 55 which have their sources connected together at ground, and which have their gates connected together and to the drains of transistors 55, 56. The node at the drains of transistors 53, 54 is connected to the gate of n-channel driver transistor 60 in the output stage of loop filter 18. The gate of p-channel output current source transistor 58 is controlled by line BIAS from current source 16, and the source/drain paths of transistors 58, 60 are connected in series between $V_{cc}$ and ground. As is well known in the active filter art, the size of transistor 58 relative to that of transistor 52 should be properly ratioed to provide for good stability. Transistor 58 thus serves as a variable current source depending upon the voltage on line BIAS. Output line VCOV from loop filter 18 is driven from the common drain node of transistors 58, 60.

Capacitor 61 is connected between line VCOV and the gate of transistor 60 to stabilize the response of loop filter 18 by providing frequency compensation in the conventional manner. Preferably, capacitor 61 is constructed as an MOS capacitor formed in an n-well or other lightly doped n-type material, with n+ source/drain regions biased to the same potential and serving as one plate, and with the gate of the MOS transistor serving as the other capacitor plate. Capacitor 61 serves to keep the output of loop filter 18 from rapidly changing responsive to a change at its input, and to maintain balance in the currents through the two legs of op amp 51 in the transient condition. The tendency of op amp 51 to oscillate in the event of a rapid change at its input is thus reduced by capacitor 61. Also in this embodiment, capacitor 63 is connected between line VCOV and ground to provide additional high frequency filtering.

Line VCOV is also connected to the drain of n-channel disable transistor 59, which has its source connected to ground and its gate driven by line ENPLL (inverted by inverter 57), so that line VCOV is forced low when disabled (line ENPLL low).

In operation, op amp 51 implements an active low-pass filter of the voltage on line VCOP, such that the voltage on line VCOV will reach, in the steady-state, the voltage on line VCOP. The slew rate of loop filter 18 depends upon the current provided by current source transistor 58, which is controlled by line BIAS from current source 16. With line BIAS relatively low, so that transistor 58 is relatively strongly turned on, the slew rate of loop filter 18 is relatively high, such that the voltage on line VCOV will respond quite rapidly to changes in the voltage on line VCOP. Conversely, with line BIAS relatively low, the current source by transistor 58 will be relatively weak, such that the voltage on line VCOV will respond relatively slowly to changes in the voltage on line VCOP.

This filtering function is accomplished without requiring external capacitors, and thus may be fully integrated into integrated circuit 2. In addition, loop filter 18 according to the present invention further includes a variable slew rate, controlled consistently with the rate at which the voltage on line VCOP changes in pump-up and pump-down cycles.

Figure 8:
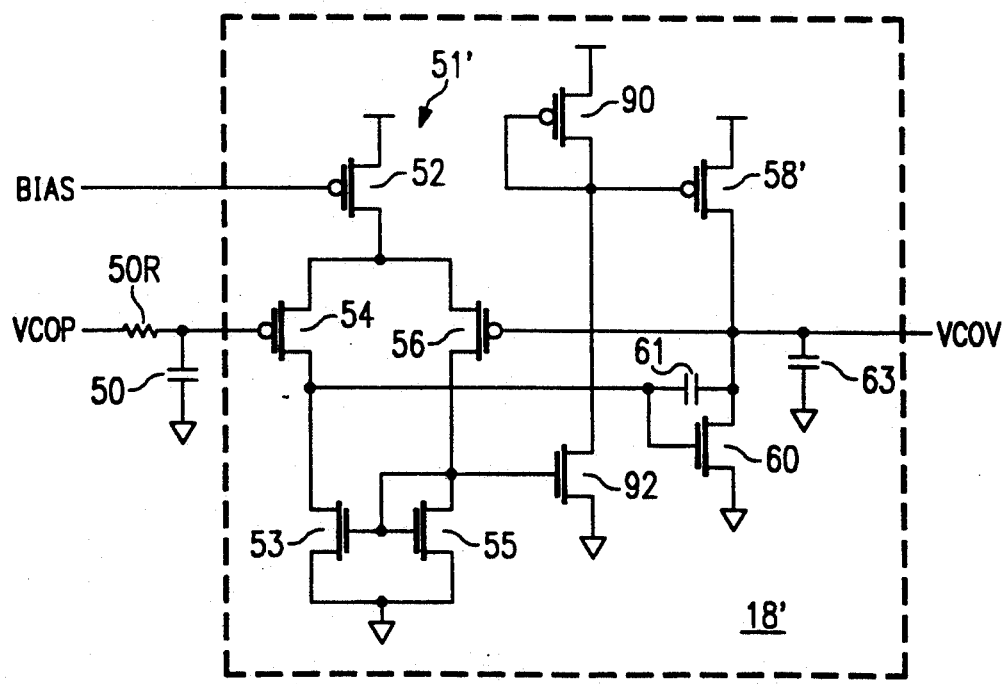
FIG. 8 is an electrical diagram, in schematic form, of an alternative embodiment of the loop filter useful in the PLL clock generator circuit constructed according to the preferred embodiment of the invention.

Referring now to FIG. 8, loop filter 18' according to an alternative embodiment of the invention will now be described. Those elements in loop filter 18' of FIG. 8 that correspond to like elements in loop filter 18 of FIG. 4 are referred to by the same reference numeral. As will be apparent from the following description, the slew rate of loop filter 18' is also controlled by line BIAS. Since the output stage of loop filter 18' is not controlled by line BIAS, however, the acceptable range of the signal on line BIAS, and its control of the slew rate of loop filter 18', are greatly increased.

Similarly to the previously-described example, loop filter 18' includes op amp 51', including p-channel current source transistor 52 having its gate controlled by line BIAS, and a pair of legs consisting of transistor pairs 54, 53 and 56, 55, interconnected as in the case of op amp 51 in loop filter 18. Loop filter 18' drives line VCOV with an n-channel pull-down transistor 60, having its gate connected to the drain of transistors 54, 53 as before, and including frequency compensation capacitor 61 connected between its gate and drain; the drain of transistor 60 is connected to line VCOV and its source is biased to ground. Line VCOV is also connected to an additional filter capacitor 63, as in the previously described example.

Rather than the use of a current source transistor controlled by line BIAS as in loop filter 18, loop filter 18' includes a push-pull type of output stage, using p-channel pull-up transistor 58' with its gate biased by another leg in loop filter 18'. This additional leg includes p-channel transistor 90 having its source biased to $V_{cc}$, and its gate and drain tied together in diode fashion and connected to the gate of transistor 58'. N-channel transistor 92 has its drain connected to the drain of transistor 90, its source biased to ground, and its gate connected to the drain node of transistors 55, 56 in op amp 51'.

In operation, therefore, the gate of p-channel transistor 58' is biased by the operation of op amp 51', and thus according to the signals on lines BIAS and VCOP. In particular, the extent to which transistor 92 may be turned on depends upon how strongly transistor 52 is turned on by line BIAS. If line BIAS is relatively low, as in the case where lines LVL2, LVL1 are both high, the voltage at the gate of transistor 92 may reach a relatively high voltage, maximizing the possible pull-up current sourcable by transistor 58'. Conversely, with line BIAS relatively high due to lines LVL2, LVL1 both low (and the maximum resistance presented in the reference leg of current source 16), the extent to which transistor 92 can be turned on is reduced, thus reducing the maximum current through transistor 58'.

As a result, the slew rate of loop filter 18' is controlled by the control of current source transistor 52 by line BIAS, with the output stage of loop filter 18' is indirectly controlled by line BIAS. This arrangement increases the range of voltages over which line BIAS varies, and thus the values of resistors 33, 35, 37, over that available in loop filter 18 in FIG. 4, since the output stage is not directly affected by the voltage on line BIAS.

In either of loop filters 18, 18', the slew rate is controlled by controlling a current source according to a reference voltage generated in current source 16, which in turn is controlled according to the relationship between the input clock signal and the feedback clock signal. This slew rate control is therefore accomplished without requiring voltage controlled compensation capacitors, or other techniques that are less suitable for stable operation or implementation into modern CMOS integrated circuits such as microprocessors and the like.

Figure 5:
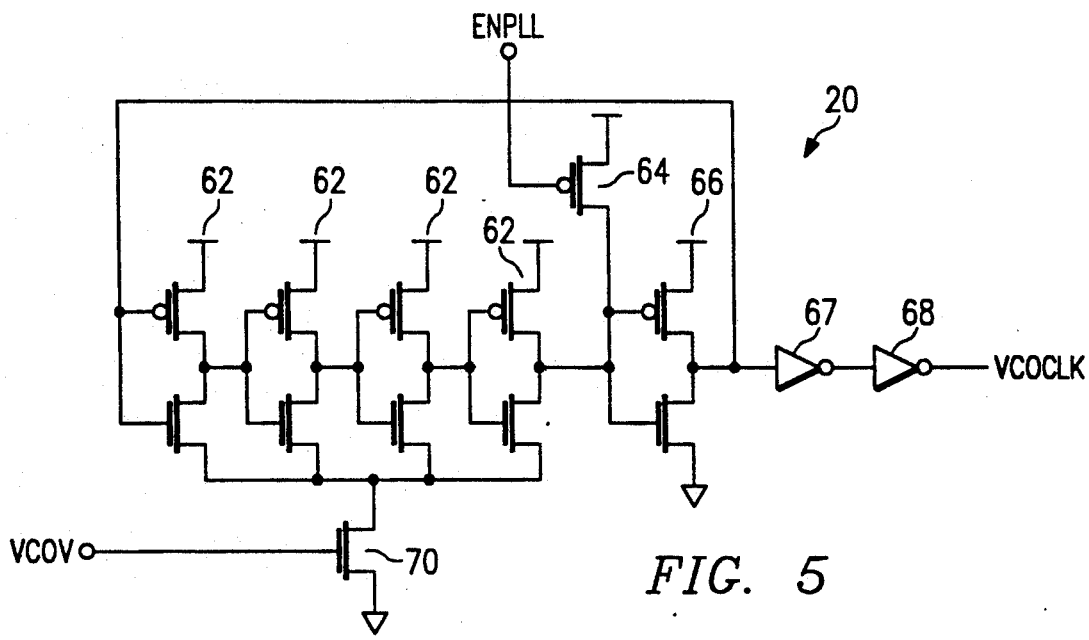
FIG. 5 is an electrical diagram, in schematic form, of the voltage controlled oscillator implemented in the PLL clock generator circuit constructed according to the preferred embodiment of the invention.

Referring now to FIG. 5, the construction of VCO 20 will now be described in further detail. In this embodiment of the invention, VCO 20 is a ring oscillator implemented by way of a series of CMOS inverters 62, 66, each consisting of a p-channel pull-up transistor and an n-channel pull-down transistor with their source/drain paths connected in series and their gates connected in common. The sources of the pull-down transistors in inverters 62 are connected to the drain of n-channel transistor 70; transistor 70 has its source connected to ground and its gate connected to line VCOV from loop filter 18. The source of the pull-down transistor in inverter 66 is connected directly to ground. Inverters 62, 66 are connected in series with one another, with the output of inverter 66 fedback to the input of the first one of inverters 62; the output of inverter 66 is also coupled (via two buffering inverters 67, 68) to drive output line VCOCLK. The input of inverter 66 is also connected to the drain of p-channel disable transistor 64, which has its source biased to $V_{cc}$ and its gate receiving line ENPLL; accordingly, the output of inverter 66 is held high in a disable condition (line ENPLL low).

In operation, as is conventional for VCOs of the ring oscillator type, the voltage on line VCOV at the gate of transistor 70 will determine the frequency of oscillation. With line VCOV high so that transistor 70 is turned on strongly, the frequency at which VCO 20 oscillates increases, since the drive current through inverters 62 increases. Conversely, with the voltage of line VCOV at a lower voltage so that transistor 70 is turned on relatively weakly, the drive current through inverters 62 decreases, thus decreasing the frequency at which VCO oscillates. Accordingly, line VCOV from the output of loop filter 18 controls the oscillation frequency of VCO 20.

As noted hereinabove and as shown in FIG. 2, the output of VCO 20 on line VCOCLK is presented to frequency divider 22, which is constructed in the conventional manner to divide down the frequency of the signal on line VCOCLK to the desired frequency. For example, it may be desirable that the output frequency on line CLKOUT equal that of the input clock frequency at terminal CLKIN. Of course, the output clock frequency on line CLKOUT may also differ from that of the input clock frequency, as desired.

Figure 6:
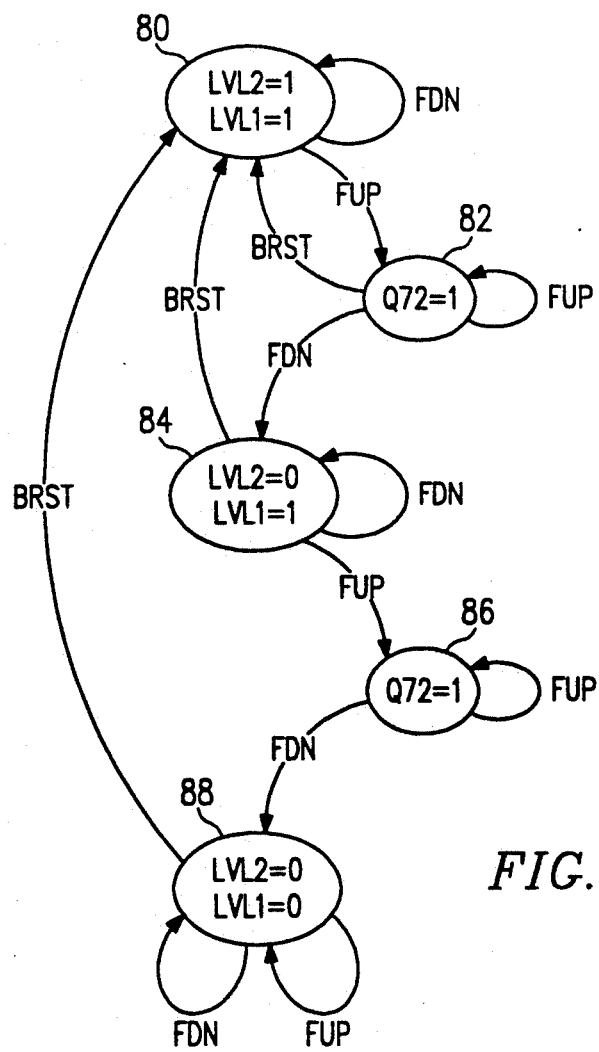
FIG. 6 is a state diagram illustrating the operation of the phase comparator in the PLL clock generator circuit constructed according to the preferred embodiment of the invention.
Figure 7:
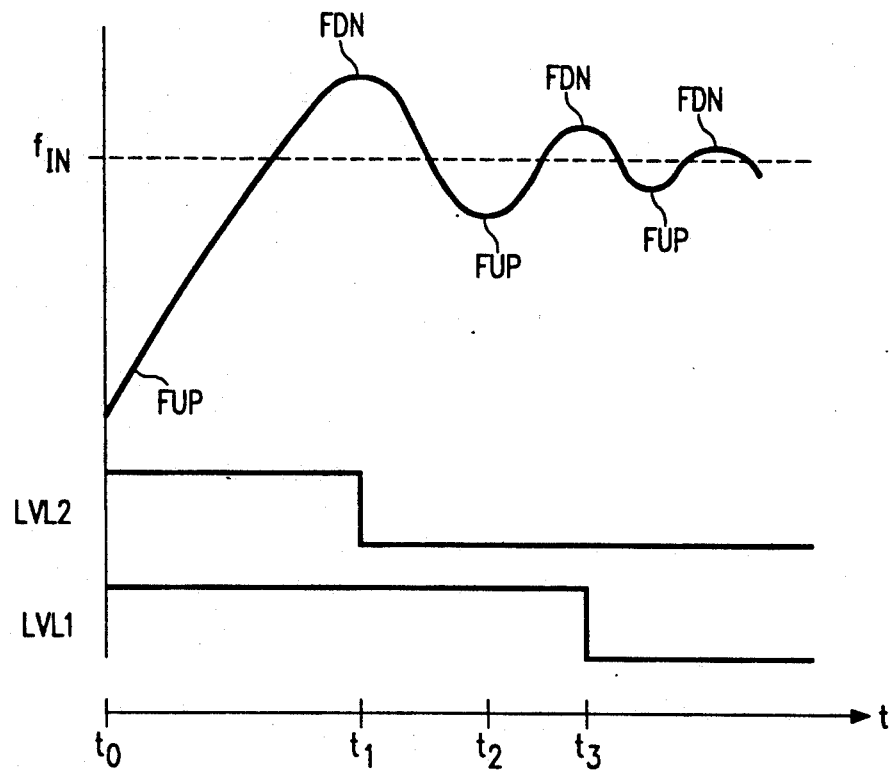
FIG. 7 is a timing diagram illustrating the operation of the PLL clock generator circuit constructed according to the preferred embodiment of the invention.

Referring now to FIGS. 6 and 7, the operation of PLL clock generator 10 will now be described beginning from a disable condition until the output clock frequency is substantially locked to a stable input clock frequency received at terminal CLKIN. FIG. 6 is a state diagram illustrating the operation of PLL clock generator 10, in particular phase comparator 14 therewithin, and FIG. 7 is a combination of a plot of frequency at line CLKOUT relative to the input clock frequency over time, with a timing diagram illustrating the FUP and FDN signals.

At time $t_0$ in the example of FIG. 6, PLL clock generator 10 is beginning the phase lock operation, for example upon first being enabled by line ENPLL at a high logic level. In this condition, the output clock frequency on line RFCLK is very much lower than that of the frequency $f_{IN}$ of the input clock on line INCLK. As such, either because of a reset operation on line RESET, or due to two rising edges of the input clock signal occurring before any rising edge of the output clock signal (i.e., line 2FUP* being low), both of lines LVL2, LVL1 are at a high logic level; this condition corresponds to state 80 in FIG. 6. Referring to FIG. 4, resistors 33, 35 are thus both shorted out in current source 16, so that the maximum current is being drawn through the reference leg. Line BIAS is thus at a relatively low voltage during this time, turning on transistors 49 and 58 to their strongest level. As such, the charging current available to capacitor 50 during such time as transistor 40 is turned on by line FUP being high is maximized, as is the slew rate of loop filter 18. The repeated leading rising edges of the clock on line INCLK prior to the clock on line RFCLK will thus continue to charge capacitor 50, raising the voltage on line VCOV at the maximum slew rate, and rapidly advancing the oscillation frequency of VCO 20.

In addition, the generation of a high level on line FUP has caused flip-flop 72 in phase comparator 14 (see FIG. 3) to be set. Referring to FIG. 6, PLL clock generator 10 is thus in state 82, having received (and continuing to receive) high levels on line FUP.

The oscillation frequency of VCO 20 will continue to be advanced until time $t_1$ in FIG. 7, at which time the rising edge of the clock on line RFCLK sufficiently leads the rising edge of the clock on line INCLK as to cause phase comparator 14 to generate a high level on line FDN prior to the high level on line FUP. At this point, the frequency of the output clock signal on line CLKOUT has overshot the desired frequency $f_{IN}$ of the input clock signal. The generation of an active signal on line FDN clocks flip-flop 76 in phase comparator 14 (see FIG. 3), which resets both flip-flops 72, 76 and clocks flip-flop 28. Line LVL2 is thus driven low, turning off transistor 32 in current source 16 and switching resistor 33 into the reference leg of the current mirror therein.

PLL clock generator 10 is now in state 84 of FIG. 7, with line LVL2 low and line LVL1 high. In this state, the addition of resistor 33 into the reference leg of current source 16 decreases its current, raising the voltage on line BIAS so that the charging (and discharging, via transistors 45, 48) current available in the output leg of current source 16 is decreased. The rate at which the voltage on line VCOP now changes responsive to transistors 40, 42 turning on is thus reduced, thus reducing the response time of current source 16 to the pump-up and pump-down signals. In addition, according to this embodiment of the invention, the higher voltage on line BIAS decreases the slew rate of loop filter 18 from the prior condition, further reducing the rate at which the frequency of VCO 20 is modulated responsive to pump-up and pump-down events.

The generation of the active signal on line FDN at time $t_1$ will retard the oscillation of VCO 20, thus reducing the frequency of the output clock on lines CLKOUT and RFCLK; continued pump-down signals on line FDN will continue with each cycle of the clock on line RFCLK, maintaining PLL clock generator 10 in state 84 of FIG. 7. This continues until such time as the clock signal on line INCLK again significantly leads the clock on line RFCLK (i.e., the output clock frequency has undershot the input frequency) so as to cause the generation of a pump-up signal on line FUP, shown at time $t_2$ in FIG. 7. This pump-up signal not only will cause VCO 20 to advance its oscillation frequency, but will also set flip-flop 72 in phase comparator 14 (FIG. 3), placing PLL clock generator 10 in state 86.

PLL clock generator 10 begins again to advance the frequency of VCO 20 responsive to the pump-up signals on line FUP, until such time as the output clock on line RFCLK again leads the input clock on line INCLK, shown at time $t_3$ in FIG. 7, at which time an active pump-down signal is again generated on line FDN. The active signal on line FDN clocks the high level from flip-flop 72 in phase comparator 14 into flip-flop 76, which in turn clocks a high level into flip-flop 30, driving low line LVL1. This condition corresponds to state 88 in FIG. 6.

With line LVL1 at a low state, transistor 34 is now also turned off (see FIG. 4). Resistor 35 is thus switched into the reference leg of current source 16, further decreasing the current therethrough. In response, line BIAS is pulled still higher, reducing the charging (and discharging) current in the output leg of current source 16, thus further reducing the rate at which the voltage on line VCOP changes responsive to pump-up and pump-down signals on lines FUP, FDN, respectively. In addition, the higher voltage on line BIAS again reduces the current provided by current source transistor 58, further reducing the slew rate of loop filter 18. Accordingly, the rate at which the frequency of VCO 20 changes responsive to pump-up and pump-down signals from phase comparator 14 is reduced to its minimum in state 88, according to this embodiment of the invention. PLL clock generator 10 will continue to operate in this locked mode, with relatively little frequency jitter in this low gain mode.

Referring back to FIGS. 3 and 6, state 80 is entered at any time that a high level is generated on line BRST. This occurs when two rising edges of either clock are received prior to a rising edge of the other (i.e., either of lines 2FUP* or 2FDN* are driven low), or if the RESET line is activated. In state 80, PLL clock generator 10 is again in its highest gain mode, so that it can rapidly advance or retard the frequency of VCO 20 to quickly lock onto the new frequency.

In addition, the state diagram of FIG. 6 also applies to the case where the input clock frequency is significantly lower than the frequency of the clock on line RFCLK. In this case, state 80 is maintained until the first undershoot of the output clock signal (FUP) followed by the first overshoot (FDN). The operation of PLL clock generator 10 continues from this point on in the same manner as described hereinabove.

As a result of the present invention, significant advantages are obtained. Firstly, the present invention provides for multiple bandwidth operation in both the advancing and the retarding of the output clock signal frequency. This multiple bandwidth control is provided by signals that operate both in the advancing and retarding mode, thus reducing the complexity of the phase comparator circuit, and reducing the likelihood of undesirable oscillation as may occur in switching between advance and retard. The implementation of this control also lends itself to provide more than two bandwidths; the above described embodiment has three bandwidths, with additional bandwidth selections available by merely providing longer shift registers in the phase comparator.

Secondly, the present invention provides for not only control of the current source portion of a charge pump loop filter, but also for control of the slew rate of the active filter itself. This ability to control both of these factors provides for greater control of the response of the VCO to pump-up and pump-down signals, and thus both improved speed in locking onto a new frequency and also improved stability in the locked condition.

The present invention can be quite readily implemented in an integrated circuit without requiring an external component such as a filter capacitor, and is compatible with state-of-the-art CMOS or MOS manufacturing technology. Furthermore, the stability offered by the PLL clock generator circuit according to the present invention is especially applicable to high frequency operation such as expected for modern microprocessors and the like.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A phase-locked loop clock generator circuit, comprising:

a phase comparator, having inputs for receiving an input clock signal and a feedback clock signal, for presenting up and down signals corresponding to the phase relationship of the input and feedback clock signals, and for presenting a first rate control signal responsive to occurrences of the up and down signals;

a charging circuit, responsive to said first rate control signal, for providing a charging current for charging and discharging a capacitance in accordance with said up and down signals, respectively;

a filter having a slew rate controlled in a manner corresponding to the charging current, and having an input coupled to said capacitance, said filter for presenting a frequency control signal corresponding to the voltage at said capacitance; and a voltage controlled circuit, having an input receiving said frequency control signal and having an output for presenting an output clock signal at a frequency corresponding to said frequency control signal, said output clock signal being coupled to said second input of said phase comparator to provide said feedback clock signal.

2. The circuit of claim 1, wherein said charging circuit comprises:

a current mirror, having a reference leg providing a reference current responsive to said first rate control signal, and having an output leg for providing the charging current for charging and discharging a capacitance responsive to said up and down signals, respectively, with the charging current corresponding to the reference current in said reference leg.

3. The circuit of claim 2, wherein the reference leg in said current mirror comprises:

a first resistor;

a reference transistor, having a conduction path coupled in series with said first resistor between a bias voltage and a reference voltage, and having a control terminal connected to a node in said series path of the conduction path and said first resistor; and a first shorting transistor, having a conduction path connected to the reference voltage in parallel with said first resistor, and having a control terminal coupled to said first rate control signal.

4. The circuit of claim 3, wherein said output leg comprises:

a pull-up transistor, having its control terminal coupled to said up signal, and having a conduction path;

a pull-down transistor, having its control terminal coupled to said down signal, and having a conduction path coupled in series with the conduction path of said pull-up transistor between a bias voltage and a reference voltage; and a current source transistor, having its conduction path connected in series with said pull-up and pull-down transistors, and having a control terminal coupled to the reference leg of said current mirror;

wherein said charge signal corresponds to the voltage at a node in said output leg between said pull-up and pull-down transistors.

5. The circuit of claim 2, wherein said phase comparator also presents a second rate control signal responsive to additional occurrences of the up and down signals;

and wherein the source current provided by the reference leg in said current mirror is also controlled by said second rate control signal.

6. The circuit of claim 5, wherein the reference leg in said current mirror comprises:

first and second resistors, connected in series;

a reference transistor, having a conduction path coupled in series with said first and second resistors between a bias voltage and a reference voltage, and having a control terminal connected to a node in said series path of the conduction path and said first and second resistors;

a first shorting transistor, having a conduction path connected to the reference voltage in parallel with said first resistor, and having a control terminal receiving said first rate control signal; and a second shorting transistor, having a conduction path connected to the reference voltage in parallel with said second resistor, and having a control terminal receiving said second rate control signal.

7. The circuit of claim 2, wherein said filter comprises:

an operational amplifier having a first input coupled to the capacitance of the current mirror, having an output stage for presenting an output, said output stage including a current source having a control input coupled to the reference leg in said current mirror, said output stage for presenting said frequency control signal to said voltage controlled circuit, and having a second input coupled to said output stage to receive a feedback signal.

8. The circuit of claim 7, wherein said filter further comprises:

a disable transistor, having a conduction path coupled between said output stage and a fixed voltage, and having a control terminal for receiving a disable signal, so that said frequency control signal is biased to said fixed voltage responsive to said disable signal.

9. The circuit of claim 2, wherein said current mirror further comprises:

a disable circuit, for biasing said bias signal and said charge signal to fixed voltages responsive to receiving a disable signal.

10. The circuit of claim 1, wherein said voltage controlled circuit is a voltage controlled oscillator.

11. The circuit of claim 10, wherein said voltage controlled oscillator further comprises:

a disable transistor, having a conduction path coupled between a node in said oscillator and a fixed voltage, and having a control terminal for receiving a disable signal, so that said frequency control signal is biased to said fixed voltage responsive to said disable signal.

12. A method of generating an output clock signal from an input clock signal in synchronized fashion, comprising the steps of:

comparing the phase of a feedback clock signal corresponding to said output clock signal to the input clock signal;

generating a pump-up signal responsive to the input clock signal leading the feedback clock signal;

generating a pump-down signal responsive to the feedback clock signal leading the input clock signal;

generating a first rate control signal;

generating a charging current for charging and discharging a capacitance to a voltage level responsive to said pump-up and pump-down signals, respectively, at a rate corresponding to the rate control signal;

filtering the voltage level of said capacitance with an active filter having a slew rate dependent upon the rate control signal; and adjusting the frequency of the output clock signal corresponding to the filtered voltage level.

13. The method of claim 12, further comprising:
disabling the output clock signal by biasing the filtered voltage level to a fixed voltage responsive to a disable signal.

14. The method of claim 12, wherein the step of generating a charging current comprises:
generating a reference current in a reference leg of a current mirror including a resistance, said reference current controlling the amplitude of said charging current in an output leg of the current mirror;

and further comprising:
responsive to detecting a plurality of edges of one of said feedback clock signal and said input clock signal, reducing the resistance in the reference leg to increase the reference current and the slew rate of said active filter.

15. The method of claim 12, wherein the step of generating a charging current comprises:
generating a reference current in a reference leg of a current mirror including a resistance, said reference current controlling the amplitude of said charging current in an output leg of the current mirror;

and further comprising:
responsive to receiving a first pair of pump-up and pump-down signals, increasing the resistance in the reference leg to reduce the reference current and to reduce the slew rate of said active filter; and responsive to receiving a second pair of pump-up and pump-down signals, again increasing the resistance in the reference leg to further reduce the reference current and to further reduce the slew rate of said active filter.

16. An integrated circuit, comprising:
an input clock terminal;
functional circuitry controlled by an internal clock presented at an internal clock node; and
a phase-locked loop clock generator circuit for generating said internal clock at said internal clock node, comprising:
a phase comparator, having a first input coupled to said input clock terminal for receiving an input clock signal, having a second input coupled to said internal clock node for receiving a feedback clock signal, for presenting pump-up and pump-down signals responsive to the phase difference between said input clock signal and said feedback clock signal, and for presenting a first rate control signal responsive to an occurrence of both of the pump-up and pump-down signals;
a current source, having first and second inputs for receiving said up and down signals, respectively, and having a first control input for receiving said first rate control signal, said current source for charging a capacitance with a charging current responsive to said pump-up signal, and for discharging the capacitance with a discharging current responsive to said pump-down signal, wherein the magnitude of the charging and discharging current is controlled responsive to said first rate control signal;

a low pass filter having an input coupled to the capacitance, and having an output stage comprising a current source controlled responsive to said first rate control signal, for presenting a frequency control signal corresponding to the voltage of the capacitance; and a voltage controlled circuit, having an input receiving said frequency control signal and having an output coupled to said internal clock node, for presenting said internal clock at a frequency corresponding to said frequency control signal.

17. The integrated circuit of claim 16, wherein said current source comprises:
a reference leg, comprising:
a first resistor;
a reference transistor, having a conduction path coupled in series with said first resistor between a bias voltage and a reference voltage, and having a control terminal connected to a node in said series path of the conduction path and said first resistor; and
a first shorting transistor, having a conduction path connected to the reference voltage in parallel with said first resistor, and having a control terminal receiving said first rate control signal, so that said first shorting transistor is turned off responsive to an occurrence of both of the pump-up and pump-down signals; and
an output leg, comprising:
pull-up and pull-down transistors, having their conduction paths coupled in series between a bias voltage and ground, and having their control terminals receiving said pump-up and pump-down signals, respectively, said capacitance coupled to a node in the series path of said pull-up and pull-down transistors;
a charging current reference transistor, having its conduction path coupled in series with the conduction path of said pull-up transistor between said bias voltage and said capacitance, and having a control terminal coupled to said reference leg so that the current through said charging current reference transistor corresponds to said reference current; and
a discharging current reference transistor, having its conduction path coupled in series with the conduction path of said pull-down transistor between said bias voltage and said capacitance, and having a control terminal coupled to said reference leg so that the current through said discharging current reference transistor corresponds to said reference current.

18. The integrated circuit of claim 16,
wherein said phase comparator also presents a second rate control signal responsive to a second occurrence of both of said pump-up and pump-down signals;
and wherein the magnitude of the charging and discharging current is also controlled responsive to said second rate control signal.

19. The integrated circuit of claim 18, wherein said current source comprises:
a reference leg, comprising:
first and second resistors, connected in series;

a reference transistor, having a conduction path coupled in series with said first and second resistors between a bias voltage and a reference voltage, and having a control terminal connected to a node in said series path of the conduction path and said first and second resistors;

a first shorting transistor, having a conduction path connected to the reference voltage in parallel with said first resistor, and having a control terminal receiving said first rate control signal, so that said first shorting transistor is turned off responsive to an occurrence of both of the pump-up and pump-down signals; and a second shorting transistor, having a conduction path connected to the reference voltage in parallel with said second resistor, and having a control terminal receiving said second rate control signal, so that said second shorting transistor is turned off responsive to a second occurrence of both of the pump-up and pump-down signals; and an output leg, comprising:

pull-up and pull-down transistors, having their conduction paths coupled in series between a bias voltage and ground, and having their control terminals receiving said pump-up and pump-down signals, respectively, said capacitance coupled to a node in the series path of said pull-up and pull-down transistors;

a charging current reference transistor, having its conduction path coupled in series with the conduction path of said pull-up transistor between said bias voltage and said capacitance, and having a control terminal coupled to said reference leg so that the current through said charging current reference transistor corresponds to said reference current;

a discharging current reference transistor, having its conduction path coupled in series with the conduction path of said pull-down transistor between said bias voltage and said capacitance, and having a control terminal coupled to said reference leg so that the current through said discharging current reference transistor corresponds to said reference current.

20. The integrated circuit of claim 16, further comprising:

a frequency divider, coupled between the output of said voltage controlled circuit and said internal clock node, for dividing down the frequency of the output of said voltage controlled circuit prior to presenting said internal clock.

21. The integrated circuit of claim 20, wherein the output of said frequency divider is coupled to present the reference clock signal to the phase comparator.

* * * * *